(12) United States Patent
Lin et al.

(10) Patent No.: US 11,127,666 B2
(45) Date of Patent: Sep. 21, 2021

(54) SEMICONDUCTOR DEVICE AND METHOD OF FORMING OPENINGS THROUGH INSULATING LAYER OVER ENCAPSULANT FOR ENHANCED ADHESION OF INTERCONNECT STRUCTURE

(71) Applicant: STATS ChipPAC Pte. Ltd., Singapore (SG)

(72) Inventors: Yaojian Lin, Jiangyin (CN); Kang Chen, Singapore (SG); Jianmin Fang, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 15/428,007

(22) Filed: Feb. 8, 2017

(65) Prior Publication Data
US 2017/0148721 A1   May 25, 2017

Related U.S. Application Data

(63) Continuation of application No. 12/964,823, filed on Dec. 10, 2010, now Pat. No. 9,601,434.

(51) Int. Cl.
*H01L 23/498* (2006.01)
*H01L 21/56* (2006.01)
(Continued)

(52) U.S. Cl.
CPC .... *H01L 23/49838* (2013.01); *H01L 21/4853* (2013.01); *H01L 21/4857* (2013.01);
(Continued)

(58) Field of Classification Search
CPC ............. H01L 2924/00; H01L 2224/97; H01L 2924/00014; H01L 2924/00012;
(Continued)

(56) References Cited

U.S. PATENT DOCUMENTS

| 6,400,021 | B1* | 6/2002 | Cho | ........................ H01L 24/02 257/738 |
| 6,740,577 | B2* | 5/2004 | Jin | .......................... H01L 24/13 438/612 |

(Continued)

FOREIGN PATENT DOCUMENTS

| TW | 200509270 A | 3/2005 |
| TW | 201216419 A | 4/2012 |

*Primary Examiner* — Edward Chin
(74) *Attorney, Agent, or Firm* — Robert D. Atkins; Patent Law Group: Atkins and Associates, P.C.

(57) ABSTRACT

A semiconductor device has a semiconductor die mounted to a carrier. An encapsulant is deposited over the semiconductor die and carrier. The carrier is removed. A first insulating layer is formed over a portion of the encapsulant within an interconnect site outside a footprint of the semiconductor die. An opening is formed through the first insulating layer within the interconnect site to expose the encapsulant. The opening can be ring-shaped or vias around the interconnect site and within a central region of the interconnect site to expose the encapsulant. A first conductive layer is formed over the first insulating layer to follow a contour of the first insulating layer. A second conductive layer is formed over the first conductive layer and exposed encapsulant. A second insulating layer is formed over the second conductive layer. A bump is formed over the second conductive layer in the interconnect site.

18 Claims, 8 Drawing Sheets

(51) Int. Cl.
*H01L 23/00* (2006.01)
*H01L 23/538* (2006.01)
*H01L 21/48* (2006.01)
*H01L 23/31* (2006.01)

(52) U.S. Cl.
CPC .......... *H01L 21/565* (2013.01); *H01L 21/568* (2013.01); *H01L 23/3114* (2013.01); *H01L 23/49811* (2013.01); *H01L 23/49816* (2013.01); *H01L 23/49822* (2013.01); *H01L 23/5389* (2013.01); *H01L 24/19* (2013.01); *H01L 24/20* (2013.01); *H01L 2224/04105* (2013.01); *H01L 2224/1132* (2013.01); *H01L 2224/1145* (2013.01); *H01L 2224/1146* (2013.01); *H01L 2224/11334* (2013.01); *H01L 2224/11849* (2013.01); *H01L 2224/12105* (2013.01); *H01L 2224/131* (2013.01); *H01L 2224/13022* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/2101* (2013.01); *H01L 2224/215* (2013.01); *H01L 2224/221* (2013.01); *H01L 2924/00013* (2013.01); *H01L 2924/01029* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/181* (2013.01)

(58) Field of Classification Search
CPC ... H01L 2224/05624; H01L 2224/1302; H01L 2224/141; H01L 2924/10253; H01L 2924/12042; H01L 2924/1461; H01L 2924/15311; H01L 2924/181; H01L 23/49838; H01L 21/4853; H01L 21/4857; H01L 21/565; H01L 23/3114; H01L 23/49811; H01L 23/49822
See application file for complete search history.

(56) References Cited

U.S. PATENT DOCUMENTS

| | | | |
|---|---|---|---|
| 6,750,135 | B2 | 6/2004 | Elenius et al. |
| 7,196,000 | B2 | 3/2007 | Lee et al. |
| 7,489,037 | B2 | 2/2009 | Chien et al. |
| 7,598,612 | B2 | 10/2009 | Yuzawa |
| 7,667,336 | B2 * | 2/2010 | Ishio ................. H01L 24/13 257/781 |
| 8,173,488 | B2 * | 5/2012 | Bauer ................ H01L 24/97 438/110 |
| 2002/0017716 | A1 * | 2/2002 | Ohtaka ............ H01L 23/49822 257/712 |
| 2004/0245614 | A1 | 12/2004 | Jobetto |
| 2006/0267094 | A1 | 11/2006 | Ahn et al. |
| 2007/0114639 | A1 | 5/2007 | Lin et al. |
| 2009/0085186 | A1 * | 4/2009 | Meyer ................ H01L 23/295 257/690 |
| 2010/0078822 | A1 | 4/2010 | Bauer et al. |
| 2010/0187677 | A1 | 7/2010 | Lee |
| 2010/0213610 | A1 | 8/2010 | Marimuthu et al. |
| 2011/0074018 | A1 * | 3/2011 | Fukuda ............ H01L 25/0657 257/737 |

\* cited by examiner

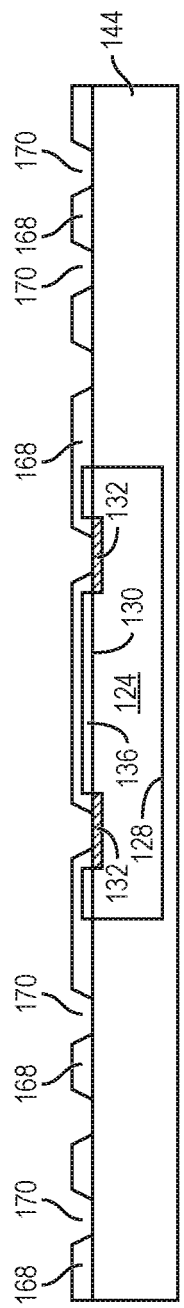
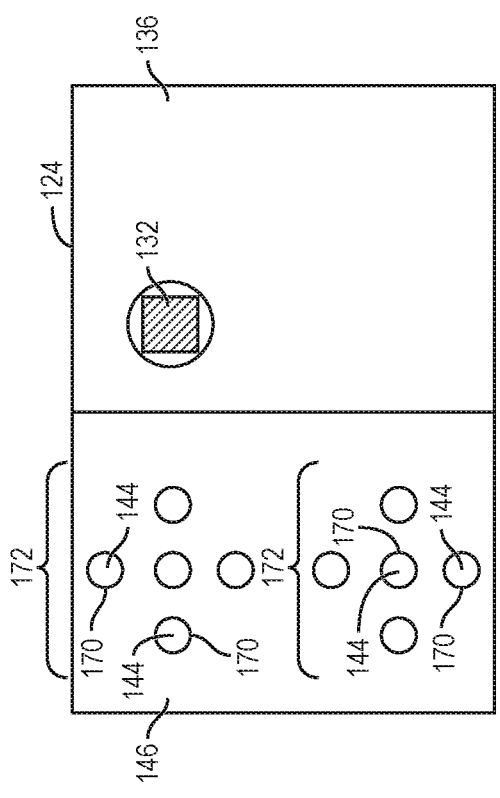
FIG. 5a
FIG. 5b

US 11,127,666 B2

SEMICONDUCTOR DEVICE AND METHOD OF FORMING OPENINGS THROUGH INSULATING LAYER OVER ENCAPSULANT FOR ENHANCED ADHESION OF INTERCONNECT STRUCTURE

CLAIM OF DOMESTIC PRIORITY

The present application is a continuation of U.S. patent application Ser. No. 12/964,823, now U.S. Pat. No. 9,601,434, filed Dec. 10, 2010, which application is incorporated herein by reference.

FIELD OF THE INVENTION

The present invention relates in general to semiconductor devices and, more particularly, to a semiconductor device and method of forming an opening through an insulating layer over an encapsulant for enhanced adhesion of an interconnect structure.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a fan-out wafer level chip scale package (Fo-WLCSP), a semiconductor die has an active surface containing analog or digital circuits implemented as active devices, passive devices, conductive layers, and dielectric layers formed within the die and electrically interconnected according to the electrical design and function of the die. An encapsulant is deposited over the semiconductor die. A first passivation layer is formed over encapsulant. A redistribution layer (RDL) is formed over first passivation layer. A second passivation layer is formed over the RDL and first passivation layer. A portion of the second passivation layer is removed by an etching process to expose RDL. Bumps are formed over the RDL in the removed portions of the second passivation layer.

The adhesion between the first passivation and encapsulant tends to be weak in many Fo-WLCSPs. The weak adhesion between the first passivation and encapsulant is particularly apparent during reliability test, e.g., drop test. The device can be rejected by post-reliability inspection, or the device could fail in the field.

BRIEF DESCRIPTION OF THE DRAWINGS

FIGS. 5a-5e illustrate another process of forming openings through an insulating layer over an encapsulant for enhanced adhesion of an interconnect structure.

DETAILED DESCRIPTION OF THE DRAWINGS

Figure 1:
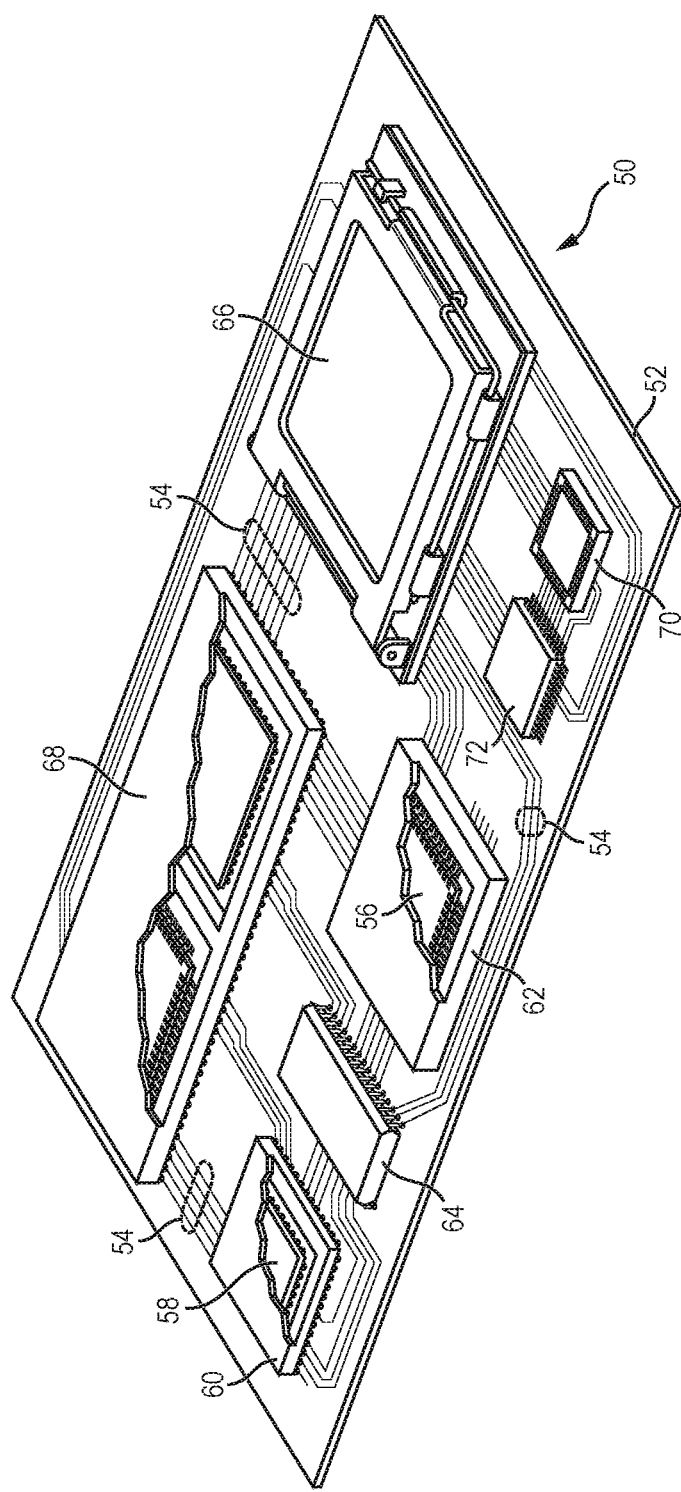
FIG. 1 illustrates a conventional bump structure formed over a semiconductor wafer.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
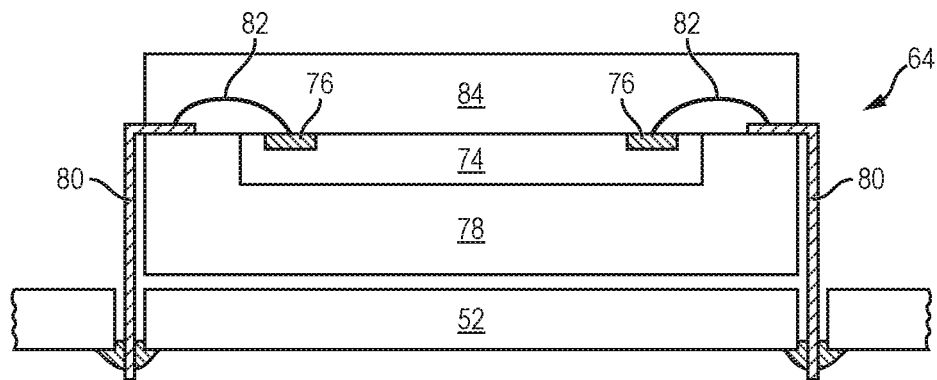
FIGS. 2a-2c illustrate a PCB with different types of packages mounted to its surface.
Figure 2B:
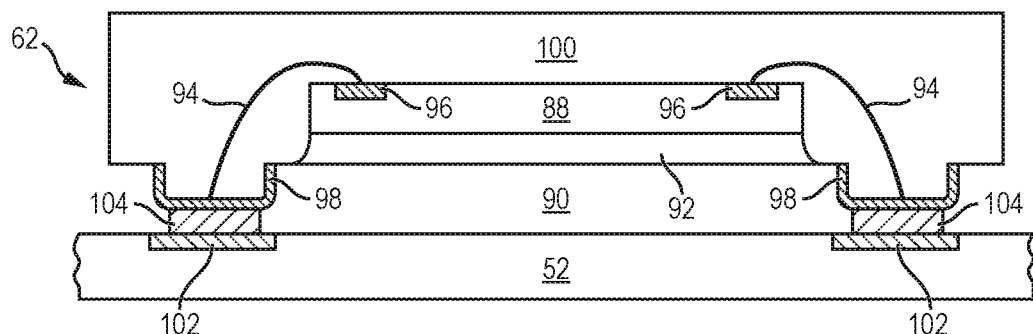
Figure 2C:
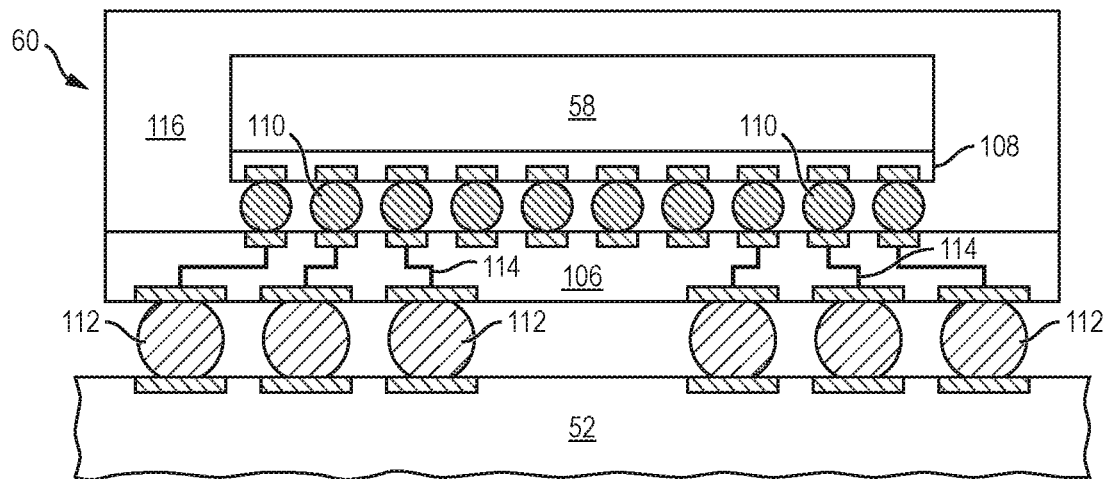

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
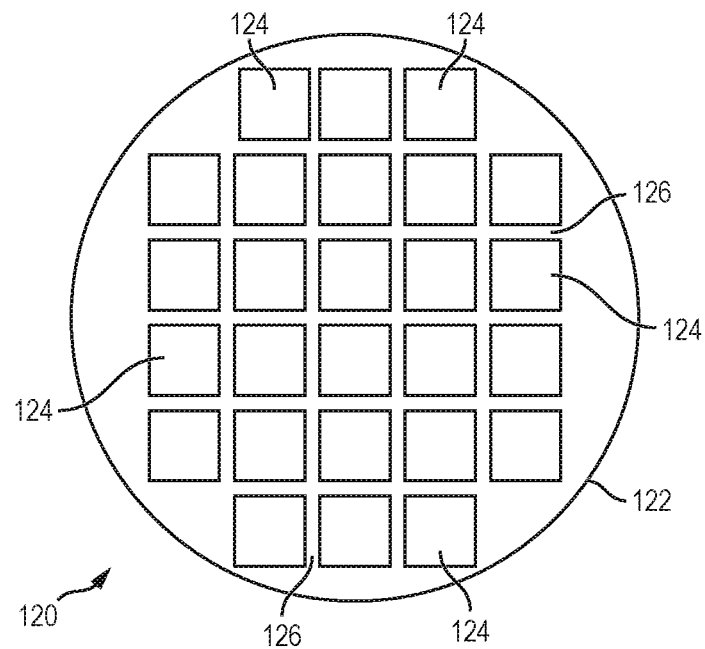
FIGS. 3a-3c illustrate further detail of the representative semiconductor packages mounted to the PCB.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
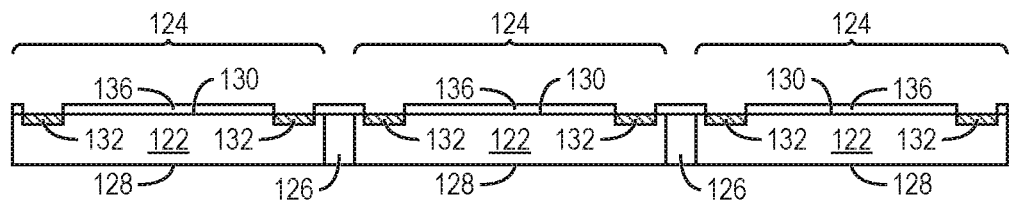

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Bumps 134 are formed on contact pads 132.

An insulating or dielectric layer 136 is formed over active surface 130 and conductive layer 132 using PVD, CVD, screen printing, spin coating, spray coating, sintering or thermal oxidation. The insulating layer 136 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 136 is removed by an etching process to expose contact pads 132.

Figure 3C:
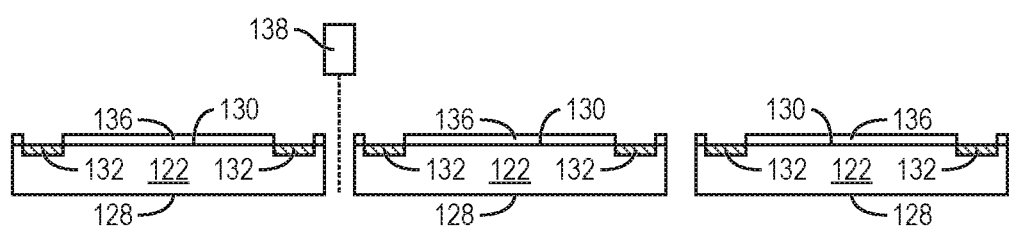

In FIG. 3c, semiconductor wafer 120 is singulated through saw street 126 using a saw blade or laser cutting tool 138 into individual semiconductor die 124.

Figure 4A:
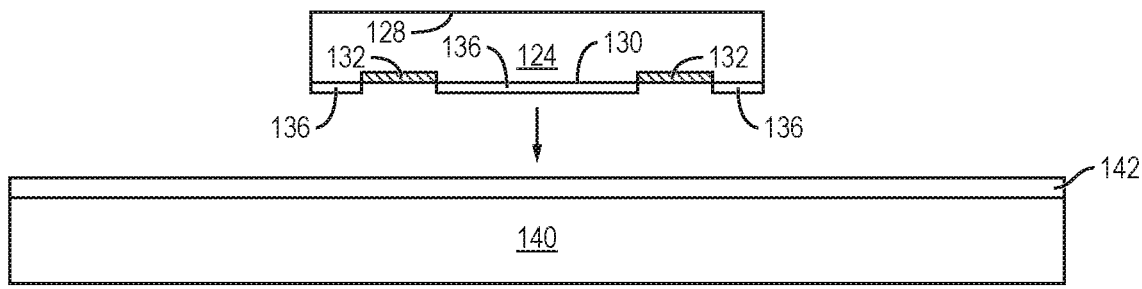
FIGS. 4a-4k illustrate a process of forming openings through an insulating layer over an encapsulant for enhanced adhesion of an interconnect structure.

FIGS. 4a-4k illustrate, in relation to FIGS. 1 and 2a-2c, a process of forming an opening through an insulating layer over an encapsulant for enhanced adhesion of an interconnect structure. FIG. 4a shows a substrate or carrier 140 containing temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer.

Figure 4B:
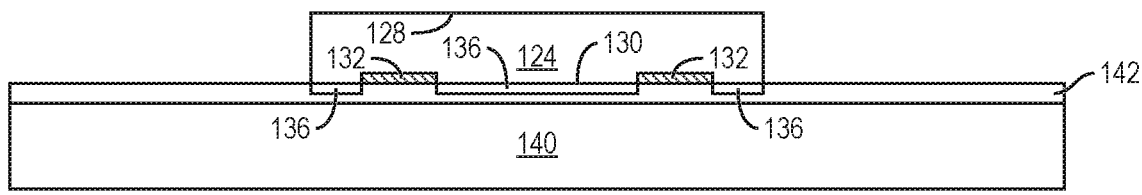

Semiconductor die 124 from FIGS. 3a-3c is positioned over and mounted to carrier 140 using a pick and place operation with insulating layer 136 oriented toward the carrier. FIG. 4b shows semiconductor die 124 mounted to carrier 140 with insulating layer 136 and contact pads 132 abutting interface layer 142.

Figure 4C:
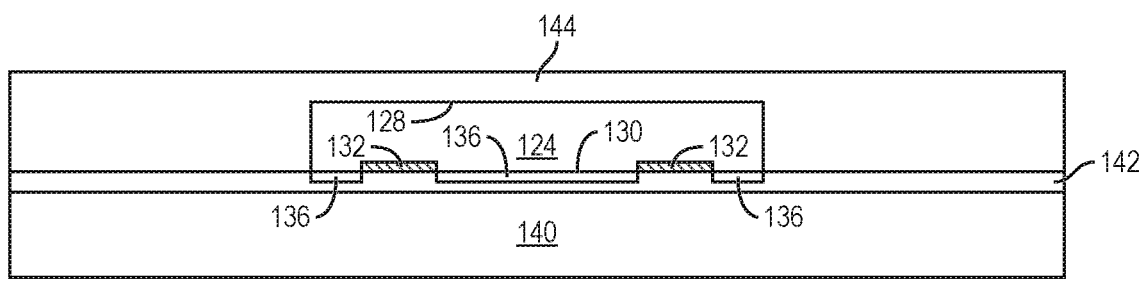

In FIG. 4c, an encapsulant or molding compound 144 is deposited over semiconductor die 124 and interface layer 142 using a paste printing, compressive molding, transfer molding, liquid encapsulant molding, vacuum lamination, spin coating, or other suitable applicator. Encapsulant 144 can be polymer composite material, such as epoxy resin with filler, epoxy acrylate with filler, or polymer with proper filler. Encapsulant 144 is non-conductive and environmentally protects the semiconductor device from external elements and contaminants.

Figure 4D:
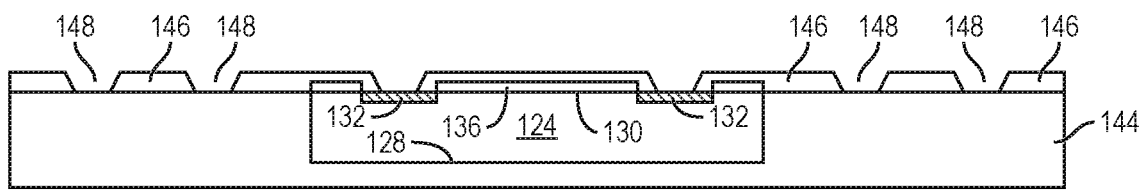

In FIG. 4d, carrier 140 and interface layer 142 are removed by chemical etching, mechanical peel-off, CMP, mechanical grinding, thermal bake, laser scanning, or wet stripping to expose contact pads 132. An insulating or passivation layer 146 is formed over semiconductor die 124 and encapsulant 144 using PVD, CVD, screen printing, spin coating, spray coating, sintering or thermal oxidation. The insulating layer 146 contains one or more layers of SiO2, Si3N4, SiON, Ta2O5, Al2O3, or other material having similar insulating and structural properties. A portion of insulating layer 146 is removed by an etching process to form an opening or via 148 and expose contact pads 132 and encapsulant 144.

Figure 4E:
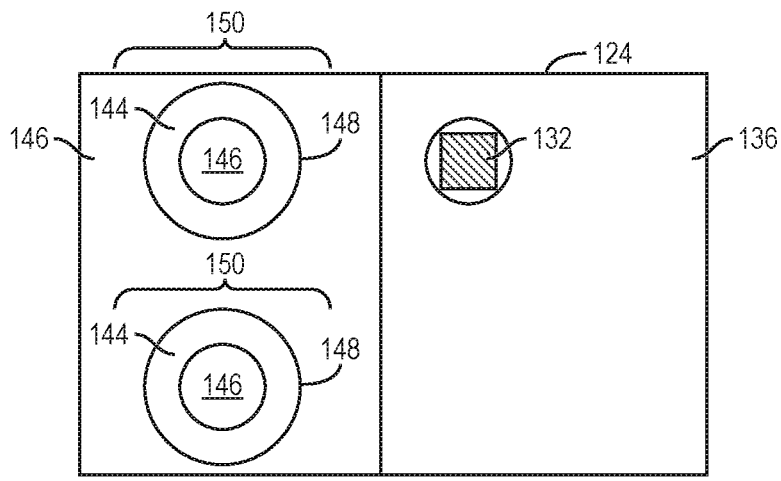

FIG. 4e shows a plan view of insulating layer 146 and opening 148. In particular, opening 148 in insulating layer 146 has a ring shape within interconnect site or bump formation area 150 to expose encapsulant 144 outside a footprint of semiconductor die 124. In one embodiment, the width of ring-shaped opening 148 is 20-100 micrometers (μm).

Figure 4F:
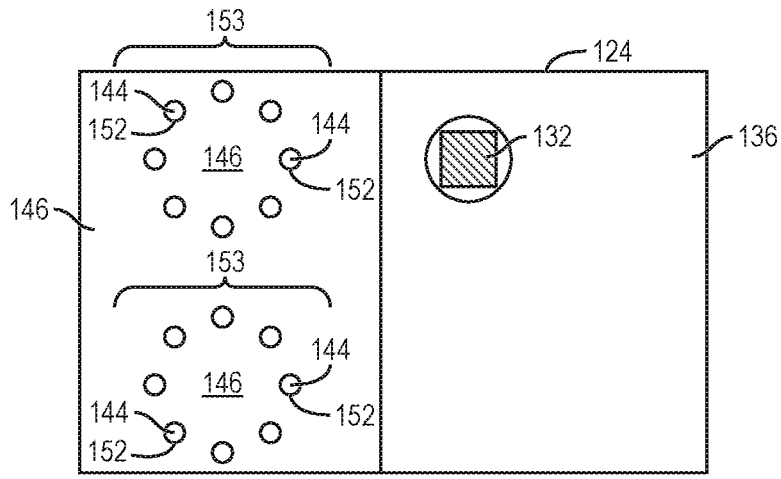

FIG. 4f shows a plan view of another embodiment of insulating layer 146 and openings 152 formed as four isolated circles or vias at 90 degree increments around interconnect site or bump formation area 153. The openings 152 have a similar cross-sectional view as FIG. 4e and expose encapsulant 144 outside a footprint of semiconductor die 124. The openings 152 can be distributed near the edge, e.g., 40 μm clearance, of interconnect site 153.

Figure 4G:
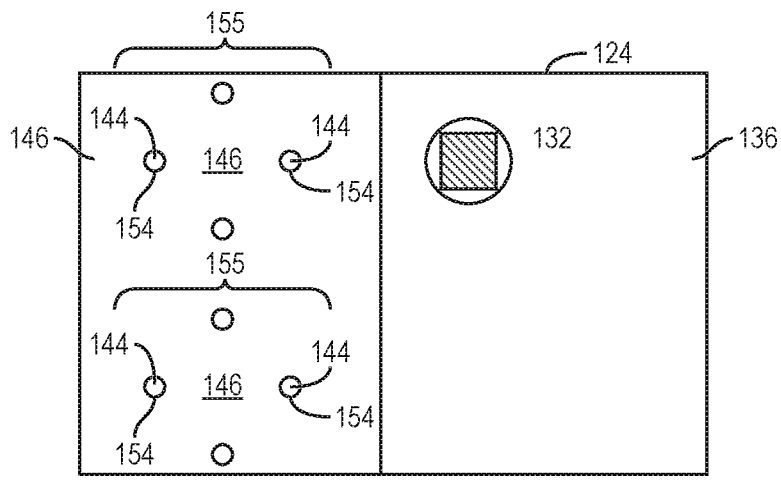

FIG. 4g shows a plan view of another embodiment of insulating layer 146 and openings 154 formed as a plurality of isolated circles or vias around a perimeter of interconnect site or bump formation area 155. The openings 154 have a similar cross-sectional view as FIG. 4e and expose encapsulant 144 outside a footprint of semiconductor die 124. The openings 154 can be distributed near the edge, e.g., 40 μm clearance, of interconnect site 155.

Figure 4H:
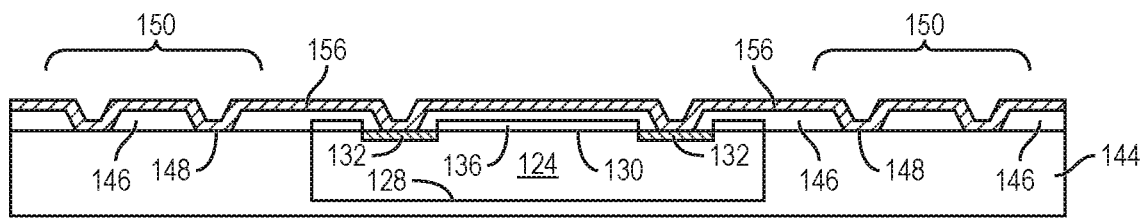

In FIG. 4h, an electrically conductive layer 156 is conformally applied over insulating layer 146, encapsulant 144, and the exposed contact pads 132 using a patterning and metal deposition process such as PVD, CVD, sputtering, electrolytic plating, and electroless plating. Conductive layer 156 can be one or more layers of Al, Cu, Sn, Ni, Au, Ag, or other suitable electrically conductive material. Conductive layer 156 follows the contour of insulating layer 146, including into ring-shaped opening 148 on encapsulant 144. More specifically, conductive layer 156 is formed directly on encapsulant 144 within ring-shaped opening 148. Likewise, conductive layer 156 is formed directly on encapsulant 144 within openings 152 and 154 of FIGS. 4f and 4g. Conductive layer 156 can be a seed layer or adhesion layer containing Ti/Cu, TiW/Cu, Ta/Cu, Cr/Cu, Ni, NiV, Au, or Al.

Figure 4I:
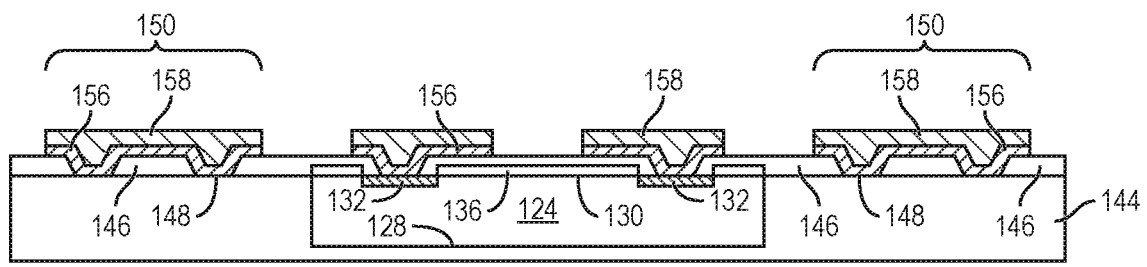

In FIG. 4i, an electrically conductive layer or RDL 158 is formed over conductive layer 156 using a patterning and metal deposition process such as PVD, CVD, sputtering, electrolytic plating, and electroless plating. Conductive layer 158 can be one or more layers of Al, Cu, Sn, Ni, Au, Ag, or other suitable electrically conductive material. The portions of conductive layer 158 can be electrically common or electrically isolated depending on the design and function of semiconductor die 124.

Figure 4J:
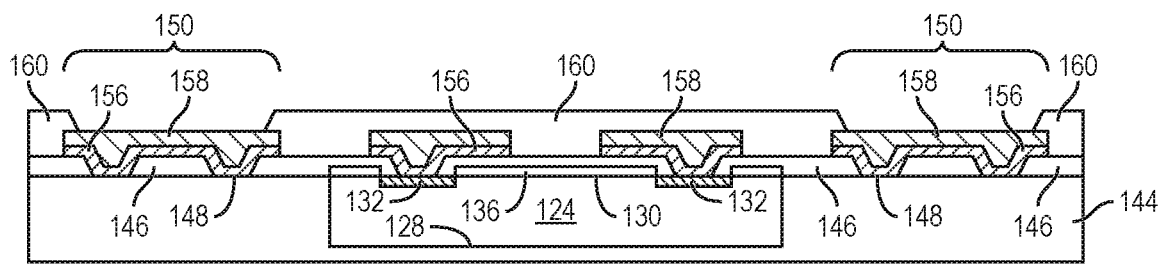

In FIG. 4j, an insulating or passivation layer 160 is formed over insulating layer 146 and conductive layer 158 using PVD, CVD, screen printing, spin coating, spray coating, sintering or thermal oxidation. The insulating layer 160 contains one or more layers of SiO2, Si3N4, SiON, Ta2O5, Al2O3, or other material having similar insulating and structural properties. A portion of insulating layer 160 is removed to expose conductive layer 158 over interconnect site or bump formation area 150.

Figure 4K:
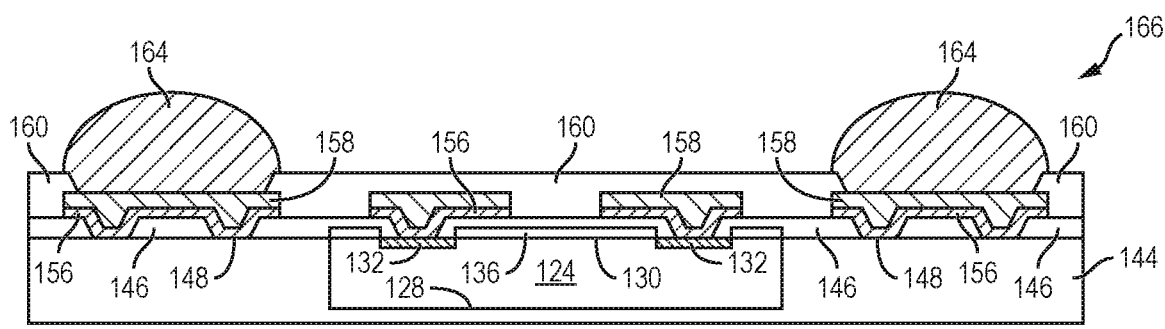

In FIG. 4k, an electrically conductive bump material is deposited over interconnect site 150 and the exposed conductive layer 158 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 158 using a suitable attachment or bonding process. In one embodiment, the bump material is reflowed by heating the material above its melting point to form spherical balls or bumps 164. In some applications, bumps 164 are reflowed a second time to improve electrical contact to conductive layer 158. The bumps can also be compression bonded to conductive layer 158. Bumps 164 represent one type of interconnect structure that can be formed over conductive layer 158. The interconnect structure can also use stud bump, micro bump, or other electrical interconnect.

In Fo-WLCSP 166, the portion of conductive layer 156 (and RDL 158) formed directly on encapsulant 144 within ring-shaped opening 148 outside a footprint of semiconductor die 124 provides enhanced adhesion and reliability for anchoring bumps 164. Likewise, conductive layer 156 (and RDL 158) can be formed directly on encapsulant 144 within openings 152 and 154 for enhanced adhesion and reliability. A portion of conductive layer 156 (and RDL 158) is disposed directly on insulating layer 146 outside a footprint of semiconductor die 124 for stress relief and buffering of encapsulant 144 and to balance the stress on the semiconductor die.

In another embodiment, continuing with the structure described up to FIG. 4c, an insulating or passivation layer 168 is formed over semiconductor die 124 and encapsulant 144 using PVD, CVD, screen printing, spin coating, spray coating, sintering or thermal oxidation, as shown in FIG. 5a. The insulating layer 168 contains one or more layers of SiO2, Si3N4, SiON, Ta2O5, Al2O3, or other material having similar insulating and structural properties. A portion of insulating layer 168 is removed by an etching process to form openings or vias 170 and expose contact pads 132 and encapsulant 144.

FIG. 5b shows a plan view of insulating layer 168 and openings 170 formed as a plurality of isolated circles or vias uniformly distributed across interconnect site or bump formation area 172. The openings 154 can be distributed near the edge, e.g., 40 μm clearance, and within an interior (central) region of interconnect site 172. The openings 170 expose encapsulant 144 outside a footprint of semiconductor die 124.

Figure 5C:
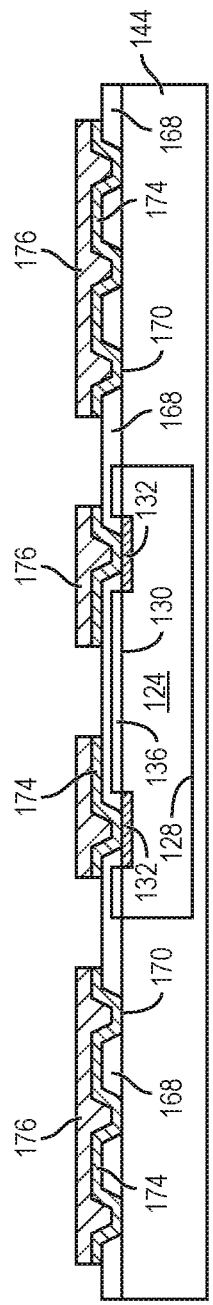

In FIG. 5c, an electrically conductive layer 174 is conformally applied over insulating layer 146, encapsulant 144, and the exposed contact pads 132 using a patterning and metal deposition process such as PVD, CVD, sputtering, electrolytic plating, and electroless plating. Conductive layer 174 can be one or more layers of Al, Cu, Sn, Ni, Au, Ag, or other suitable electrically conductive material. Conductive layer 174 follows the contour of insulating layer 146, including into openings 170 on encapsulant 144. More specifically, conductive layer 174 is formed directly on encapsulant 144 within openings 170. Conductive layer 170 can be a seed layer or adhesion layer containing Ti/Cu, TiW/Cu, Ta/Cu, Cr/Cu, Ni, NiV, Au, or Al.

An electrically conductive layer or RDL 176 is formed over conductive layer 174 using a patterning and metal deposition process such as PVD, CVD, sputtering, electrolytic plating, and electroless plating. Conductive layer 176 can be one or more layers of Al, Cu, Sn, Ni, Au, Ag, or other suitable electrically conductive material. The portions of conductive layer 176 can be electrically common or electrically isolated depending on the design and function of semiconductor die 124.

Figure 5D:
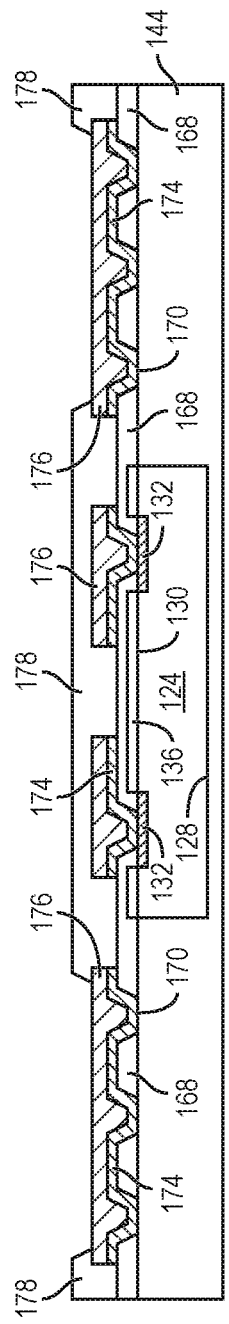

In FIG. 5d, an insulating or passivation layer 178 is formed over insulating layer 146 and conductive layer 176 using PVD, CVD, screen printing, spin coating, spray coating, sintering or thermal oxidation. The insulating layer 178 contains one or more layers of SiO2, Si3N4, SiON, Ta2O5, Al2O3, or other material having similar insulating and structural properties. A portion of insulating layer 178 is removed to expose conductive layer 176 over interconnect site or bump formation area 172.

Figure 5E:
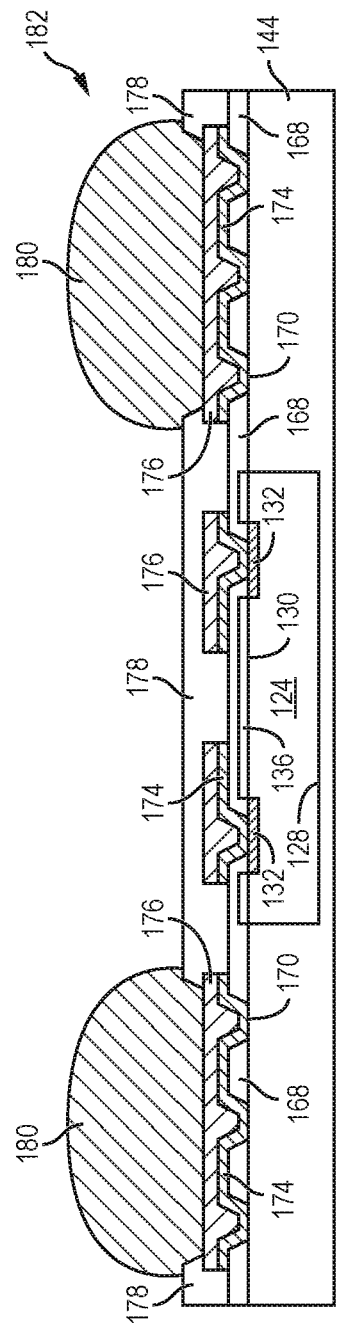

In FIG. 5e, an electrically conductive bump material is deposited over interconnect site 172 and the exposed conductive layer 176 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 176 using a suitable attachment or bonding process. In one embodiment, the bump material is reflowed by heating the material above its melting point to form spherical balls or bumps 180. In some applications, bumps 180 are reflowed a second time to improve electrical contact to conductive layer 176. The bumps can also be compression bonded to conductive layer 176. Bumps 180 represent one type of interconnect structure that can be formed over conductive layer 176. The interconnect structure can also use stud bump, micro bump, or other electrical interconnect.

In Fo-WLCSP 182, the portion of conductive layer 174 (and RDL 176) formed directly on encapsulant 144 within openings 170 outside a footprint of semiconductor die 124 provides enhanced adhesion and reliability for anchoring bumps 180. A portion of conductive layer 174 (and RDL 176) is disposed directly on insulating layer 146 outside a footprint of semiconductor die 124 for stress relief and buffering of encapsulant 144 and to balance the stress on the semiconductor die.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a semiconductor die including a top surface and a bottom surface opposite the top surface and a side surface extending vertically between the top surface and bottom surface;
an encapsulant deposited around and in contact with the side surface of the semiconductor die;
a first insulating layer formed in contact with a surface of the encapsulant, wherein the first insulating layer includes a plurality of openings through the first insulating layer and terminating at the surface of the encapsulant with the openings disposed within a single interconnect pad location over the encapsulant in a location outside a vertical projection of entire dimensions of the top surface of the semiconductor die; and
a first conductive layer formed over the interconnect pad location and into the openings in the first insulating layer to fill the openings and extend over a surface of the first insulating layer.

2. The semiconductor device of claim 1, further including a bump formed over the interconnect pad location over the first conductive layer.

3. The semiconductor device of claim 1, wherein the openings include a ring shape.

4. The semiconductor device of claim 1, wherein the openings include a plurality of vias formed within a perimeter of the interconnect pad location.

5. The semiconductor device of claim 1, wherein the openings include a via hole formed through the first insulating layer in a center of the interconnect pad location.

6. The semiconductor device of claim 1, further including a second insulating layer formed over the semiconductor die, wherein the first insulating layer extends over the second insulating layer to contact a second conductive layer on the semiconductor die.

7. A semiconductor device, comprising:
a semiconductor die including a top surface and a bottom surface opposite the top surface and a side surface extending vertically between the top surface and bottom surface;
an encapsulant deposited around the side surface of the semiconductor die;
a first insulating layer formed over a surface of the encapsulant, wherein the first insulating layer includes a plurality of openings into the first insulating layer and terminating at the surface of the encapsulant with the openings disposed within an interconnect pad location over the encapsulant outside a vertical projection of the semiconductor die, and an area of openings is less than an area of the interconnect pad location; and
a first conductive layer formed over the interconnect pad location and into the openings in the first insulating layer and extending over a surface of the first insulating layer opposite the encapsulant.

8. The semiconductor device of claim 7, further including an interconnect structure formed over the interconnect pad location over the first conductive layer.

9. The semiconductor device of claim 8, wherein the interconnect structure includes a bump.

10. The semiconductor device of claim 7, wherein the openings are formed in a ring shape.

11. The semiconductor device of claim 7, wherein the openings include a plurality of vias formed within a perimeter of the interconnect pad location.

12. The semiconductor device of claim 7, further including a second insulating layer formed over the semiconductor die, wherein the first insulating layer extends over the second insulating layer to contact a second conductive layer on the semiconductor die.

13. A semiconductor device, comprising:
- a semiconductor die including a top surface and a bottom surface opposite the top surface and a side surface extending vertically between the top surface and bottom surface;
- an encapsulant deposited around the side surface of the semiconductor die;
- a first insulating layer formed over a surface of the encapsulant, wherein the first insulating layer includes a plurality of openings into the first insulating layer and terminating at the surface of the encapsulant with the openings disposed within an interconnect pad location over the encapsulant outside a vertical projection of the semiconductor die; and
- a first conductive layer formed over the interconnect pad location and into the openings in the first insulating layer.

14. The semiconductor device of claim 13, further including an interconnect structure formed over the interconnect pad location over the first conductive layer.

15. The semiconductor device of claim 14, wherein the interconnect structure includes a bump.

16. The semiconductor device of claim 13, wherein the openings are formed in a ring shape.

17. The semiconductor device of claim 13, wherein the openings include a plurality of vias formed within a perimeter of the single interconnect pad location.

18. The semiconductor device of claim 13, further including a second insulating layer formed over the semiconductor die, wherein the first insulating layer extends over the second insulating layer to contact a second conductive layer on the semiconductor die.

\* \* \* \* \*